United States Patent [19]

Ban et al.

[11] 4,389,084
[45] Jun. 21, 1983

[54] OBSERVING APPARATUS

[75] Inventors: Mikichi Ban, Yokohama; Susumu Ito, Tokyo, both of Japan

[73] Assignee: Canon Kabushiki Kaisha, Tokyo, Japan

[21] Appl. No.: 139,768

[22] Filed: Apr. 14, 1980

Related U.S. Application Data

[63] Continuation of Ser. No. 958,890, Nov. 3, 1978, abandoned.

[30] Foreign Application Priority Data

Nov. 9, 1977 [JP] Japan ............................ 52-134223

[51] Int. Cl.³ .......................................... G02B 21/06
[52] U.S. Cl. ................................. 350/524; 350/394; 350/399; 350/503
[58] Field of Search ...................... 350/15, 27, 55, 81, 350/91, 394, 399; 356/150, 369, 399, 400, 401

[56] References Cited

U.S. PATENT DOCUMENTS 3,748,015  7/1973  Offner ................................. 350/55
3,853,398 12/1974  Kano ................................. 350/81 X

FOREIGN PATENT DOCUMENTS 2410924  9/1974  Fed. Rep. of Germany ........ 350/81

Primary Examiner—John K. Corbin
Assistant Examiner—Matthew W. Koren
Attorney, Agent, or Firm—Fitzpatrick, Cella, Harper & Scinto

[57] ABSTRACT

An observing apparatus for observing if a mask for producing semiconductor circuit element and a wafer are aligned to a determined positional relationship. The apparatus is featured in eliminating the light reflected by the mask by the use of a phase mirror and an optical analyzer, thus allowing to observe the mask and wafer without difference in brightness.

4 Claims, 6 Drawing Figures

OBSERVING APPARATUS

This is a continuation of application Ser. No. 958,890, filed Nov. 3, 1978 now abandoned.

BACKGROUND OF THE INVENTION

1. Field of the Invention

The present invention relates to an observing apparatus for a mask and wafer for producing a semiconductor circuit element.

2. Description of the Prior Art

In the manufacture of semiconductor circuit elements a mask image is projected onto a wafer to print said image on said wafer. Prior to said printing the mask should be properly aligned with respect to the wafer. Said alignment is usually achieved by illuminating the mask with a light not actinic to said wafer, illuminating the wafer with the light transmitted by said mask wafer and observing the thus illuminated mask and wafer or the alignment marks provided on said mask and wafer through an observing optical system.

As examples of such aligning methods there are already known so-called manual alignment in which an operator observes the positional relationship of mask and wafer through an observing optical system consisting of a microscope and manually achieves the alignment of mask and wafer, and so-called automatic alignment in which the positional relationship of mask and wafer is photoelectrically determined by observation of alignment marks with an observing optical system containing a photoelectrical scanner and is supplied to a processing circuit which automatically displaces either one of the mask and wafer with respect to the other by means of an x-y-$\theta$ adjuster. The apparatus of the present invention is applicable to either of these methods.

For printing the mask pattern onto the wafer there are known a contact method in which the mask and wafer are maintained in mutual contact, a proximity method in which the mask and wafer are maintained in close proximity, and a projection method in which the mask pattern is projected onto the wafer. The apparatus of the present invention is applicable to the printer utilizing said projection method.

As the projection optical system to be employed in the printer of projection method, there are known a refractive optical system and a reflective optical system, the latter being considered generally advantageous over the former in terms of chromatic aberration.

A reflective optical system and a printer utilizing such optical system are disclosed in the U.S. Pat. No. 3,748,015 and the German OLS No. 2,410924 in which an observing apparatus is composed of an observing optical system to which the light from the mask and wafer is guided by means of a beam splitter positioned therebetween.

Also the present applicant disclosed, in the Japanese Patent application No. Sho 52-120420 filed on Oct. 6, 1977, a printer utilizing a reflective optical system and provided with an observing system on the light source side with respect to the mask.

The present invention relates to an improvement in the observing apparatus for mask and wafer disclosed in connection with the above-mentioned printer, said improvement being featured in enabling removal of the reflected light from the mask which hinders clear observation.

In the observing optical system disclosed in the above-mentioned German OLS No. 2,410924 the light directly reflected from the mask is not introduced into the observing system and hence poses no problem as a beam splitter is positioned between the mask and wafer to guide the light to the observing optical system, but said reflection from the mask becomes a problem in case the observing system is located on the illuminating source side with respect to the mask as in the above-mentioned patent application filed on Oct. 6, 1977.

More specifically the mask generally composed of a glass substrate provided with an evaporated chromium layer provides a strong reflection while the wafer illuminated with the light transmitted by (passed through) the mask provides a weak reflection. For this reason the brightnesses of mask and wafer in the observing system are significantly different, giving rise to difficulty in observation.

A method of eliminating the light reflected from the mask in a printer with an observing system positioned on the illuminating source side is already disclosed in the U.S. Pat. No. 3,853,398 of the present applicant.

Said method consists of illuminating the mask with a linearly polarized light, providing between the mask and wafer a $\lambda/4$ plate which changes the light transmitted by the mask, reflected by the wafer and again transmitted by the mask into a linearly polarized state in a direction perpendicular to the polarizing direction of the above-mentioned illuminating light, and providing the observing optical system with a polarizing plate (analyser) to eliminate the light thus directly reflected by the mask, thereby eliminating said light.

The above-mentioned method, however, due to the use of said $\lambda/4$ plate giving rise to a chromatic aberration, is not suitable for use in a printer utilizing a reflective imaging system not associated with chromatic aberration as disclosed in the present invention.

SUMMARY OF THE INVENTION

The object of the present invention is to provide an observing apparatus utilizing a reflective optical system for forming a mask image on the wafer and provided with an observing system for mask and wafer on the illumination source side with respect to the mask, said apparatus being capable of eliminating the light directly reflected by the mask without giving rise to a chromatic aberration.

The above-mentioned object can be achieved by providing a phase mirror in the light path between the mask and wafer, illuminating the mask with a linearly polarized light and further providing a polarizing means, in the common light path for the light re-transmitted by the mask and the light directly reflected by the mask, for interrupting thus directly reflected light.

DESCRIPTION OF THE PREFERRED EMBODIMENTS

Now there will be given a detailed explanation of the present invention, while making reference to the attached drawings.

Figure 1:
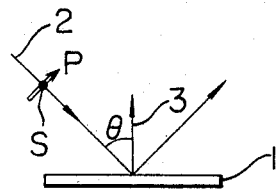
FIG. 1 is an explanatory view of a phase difference mirror.
Figure 2:
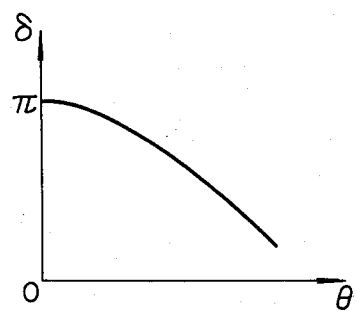
FIG. 2 is a characteristic chart showing the relationship between the incident angle and phase difference of said mirror shown in FIG. 1.

At first an explanation on the phase-difference mirror will be given with reference to FIG. 1. It is already well known that, when a light beam enters a mirror with an incident angle $\theta$, the reflectance and phase of the P-polarized component parallel to the incident plane (a plane including the incident light and emergent light) and of the S-polarized component perpendicular to said incident plane change according to the incident angle $\theta$. Referring to FIG. 1, an incident light 2 enters a mirror surface 1 with an incident angle $\theta$ to the line normal to said mirror surface 1, said incident light including a P-polarized component parallel to the incident plane (i.e., plane of paper) and an S-polarized component perpendicular to said incident plane. The phase difference $\delta$ between the P-polarized component and S-polarized component can be expressed as a function of incident angle $\theta$ as shown in FIG. 2. A mirror creating a phase difference between the P-polarized component and S-polarized component when these components enter the mirror with a same phase is called a phase-difference mirror, which can be easily obtained by coating a glass substrate with a metal, for example aluminum.

Figure 3:
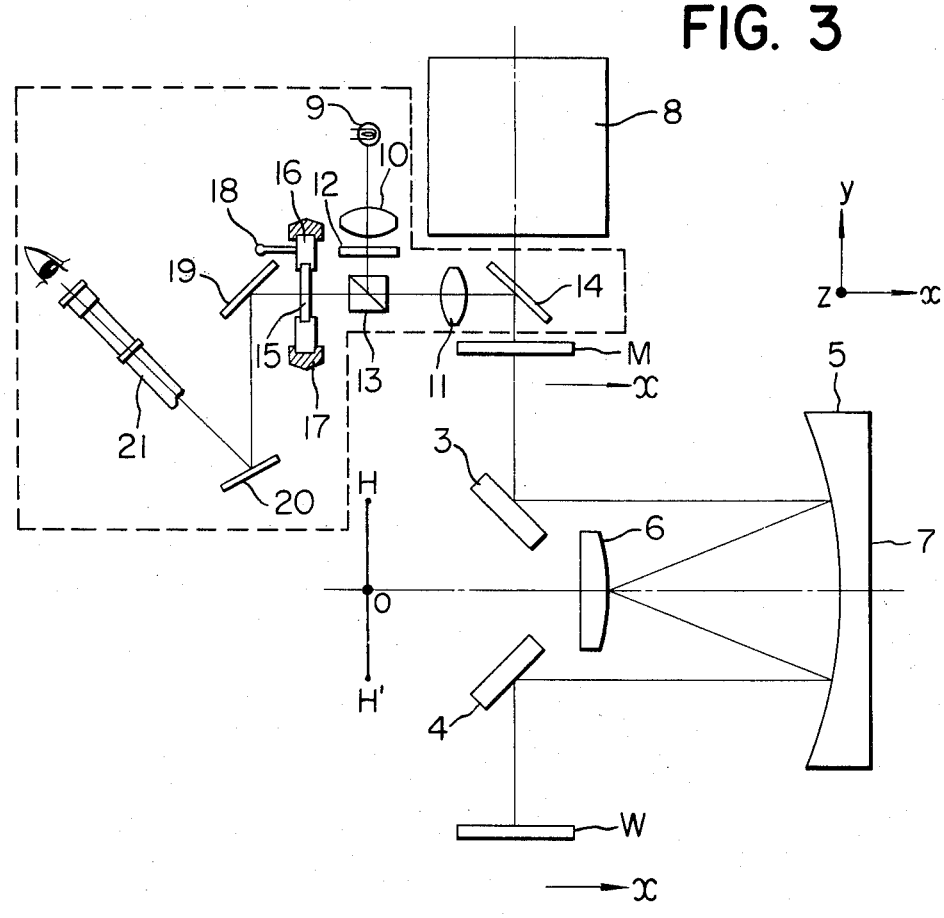
FIG. 3 is a drawing showing the optical arrangement of the observing apparatus of the present invention.

FIG. 3 shows the optical arrangement of the observing apparatus of the present invention in a state of inspection, the component surrounded by the broken line being retracted in a manner to be explained later from the printing optical path in a state of printing. A reflective optical system for projecting a pattern of a mask M onto a wafer W is composed of planar mirrors 3, 4, a concave mirror 5, a convex mirror 6, said concave and convex mirrors having a common center of curvature at a point O on the optical axis 7. If the planar mirrors 3, 4 are disregarded as they are inserted merely for deflecting the optical path and have no relevance to the imaging ability of the system, an object of a height H at the point O is focused, without any aberration and with a magnification of unity, on a point H' symmetric with respect to the optical axis 7. However, as the imaging area without aberration is limited to the vicinity of height H, an arc-shaped area with a radius of height H is utilized for imaging. The above-mentioned points H, H' respectively correspond to the positions of mask M and wafer W. Thus it is possible to print the entire pattern of mask M onto the wafer W by illuminating an arc-shaped area of the mask M with the illuminating system 8 and simultaneously displacing the mask M and wafer W in the direction X along the plane of paper. Said illuminating system 8 is provided with retractable filters in order to emit a light not actinic to the wafer, for example green light, at the alignment, and a far ultraviolet light at the printing. Such difference in the wavelength of lights used in the alignment and in the printing results in a problem of color dispersion at the printing operation.

In the above-explained optical system, as the principal ray always enters each mirror in a slanted state, the total phase difference $\Delta$ of the entire system between the P-polarized component and S-polarized component becomes equal to the sum of phase differences $\delta$ at various mirror surfaces. Strictly speaking said phase difference $\Delta$ becomes different for the rays other than the principal ray due to the difference in the incident angle thereof, but such difference in the phase difference is generally negligibly small. In FIG. 3, as the incident planes for the mirror surfaces are all parallel to the paper plane, the total phase difference $\Delta$ can be expressed by the following equation:

$$\Delta = \delta_3 \delta_4 + \delta_6 + \delta_7 + \delta_8$$

wherein $\delta_3$, $\delta_4$, $\delta_6$, $\delta_7$ and $\delta_8$ are the phase differences caused at the mirror surfaces 3, 4, 6 and 7. If the mask illuminating light is linearly polarized in a direction not perpendicular to the paper plane (z-direction) or in a direction not parallel to the x-direction but forming an angle therewith, the light entering the wafer W becomes elliptically polarized, and the light reflected by the wafer assumes, upon re-transmission of mask M, a polarized state different from the above-mentioned linearly polarized state. The reflected light from the wafer also illuminates the mask M and is scattered by the pattern thereof, but said scattered light is in a polarized state the same as that of the reflected light from the wafer. Thus, as the mask and wafer are in a mutually conjugate relationship, it is rendered possible, by eliminating the above-mentioned linearly polarized component, to simultaneously observe images of mask and wafer with an elevated contrast and without flare resulting from the light directly reflected by the mask.

There is provided an inspection light source 9 which illuminates the mask M through lenses 10 and 11. In the light path there are provided a half mirror 13, a mirror 14 and a polarizing plate 12 which deflect the light to the mask M and cause the illuminating light for mask M to be polarized in a direction of 45° to the x-direction. The reflected light from the mask M is guided through the mirror 14, lens 11 and half mirror 13 to enter a polarizing plate 15, which is rotated by means of a rotating mechanism consisting of rotatable cylindrical plate supports 16, cylindrical fixed supports 17 and a knob 18, so as to prohibit transmission of said light.

On the other hand the reflected light from the wafer W and the scattered light from the mask M illuminated by said reflected light are guided through the mirrors 14, 11, half mirror 13, polarizing plate 15 and mirrors 19, 20 to enter an eyepiece 21 which therefore allows simultaneous observation of the mask M and wafer W. If the mask M is difficult to observe in this state, the view thereof can be improved by rotating the polarizing plate 15 to allow entry to the light reflected by the mask M. Though the polarized states of normally reflected light and scattered light from the mask become completely orthogonal when the phase difference $\Delta$ of the reflective optical system is equal to $\frac{1}{4}$ of wavelength, such complete orthogonal state is not reached if said phase difference is not equal to $\frac{1}{4}$ of wavelength. In such state, therefore, the quantity of light transmitting the polarizing plate 15 becomes reduced when the reflected light is completely interrupted by said polarizing plate 15. However such reduction in light quantity can be compensated by intensifying the light source 9, as the noise component can be eliminated by the complete interruption of the reflected light.

In the present reflective optical system, the incident angle to mirrors is 45° for the mirrors 3 and 4, and is small for mirrors 6 and 7. As phase difference $\delta$ is approximately equal to $\pi$ for a small incident angle as shown in FIG. 2, the total phase difference $\Delta$ can be considered, as an approximation, equal to the sum of the phase differences created at the mirrors 3 and 4. In the following, however, there is shown an example in which the phase differences created by the mirrors 6 and 7 are also taken into consideration.

Figure 5:
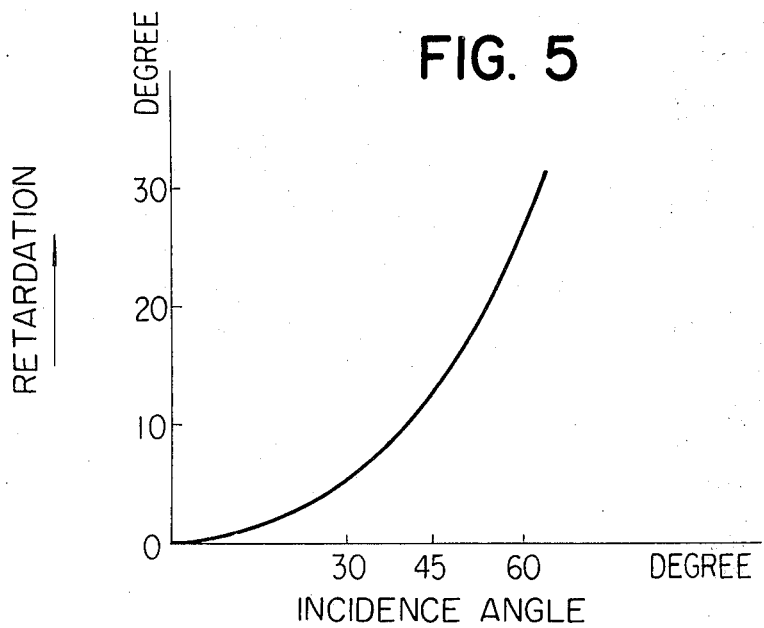
FIG. 5 is a chart showing the relationship between the incident angle and phase difference of an aluminum evaporated layer.

FIG. 5 shows the measured relationship between the incident angle and phase difference in case of an aluminum evaporated layer at a wavelength of 633 nm. The phase retardation is represented in degrees, or in wavelength unit when divided by 360°. Thus a phase retardation of 20° corresponds to that of 1/18 of wavelength.

Figure 6:
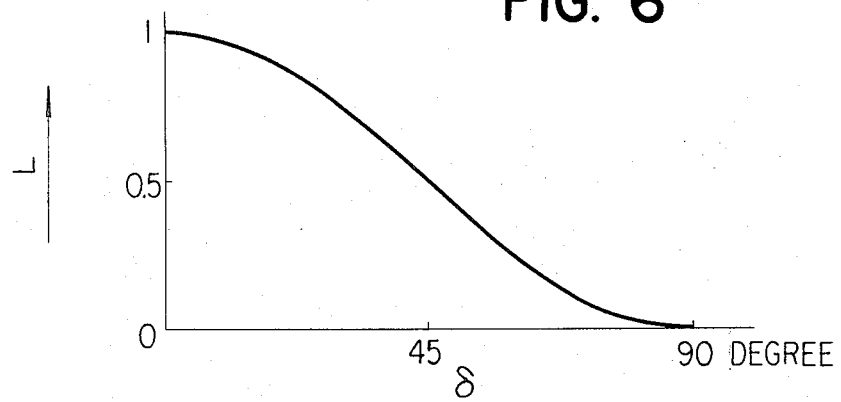
FIG. 6 is a chart showing the light loss as a function of phase difference.

FIG. 6 shows the light loss as a function of phase difference. The light loss L becomes zero at a phase difference 90° (¼ of wavelength), and can be generally expressed by $(1 + \cos 2\delta)/2$.

When the effective F-number is Fe 3.5 in the optical system shown in FIG. 3, the incident angles at the mirrors 3, 4, 6 and 7 are respectively 45°, 45°, 20° and 10°. Consequently the total phase difference $\Delta$ can be calculated from the phase retardation caused at each mirror surface determinable from FIG. 5:

$\Delta = 13° + 13° + 3° + 1° \times 2 = 31° = 1/12$ of wavelength which is approximately equal to 1/10 of wavelength, thus causing a light loss of ca. 74%.

Figure 4:
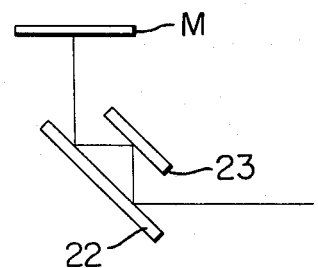
FIG. 4 is a drawing showing a mirror for increasing the phase difference.

The light loss can be reduced by rendering the phase retardation $\Delta$ closer to ¼ of wavelength. FIG. 4 shows an alternative arrangement for the mirror 3 shown in FIG. 3, wherein a mirror 23 provides a reflection and a mirror 22 provides two reflections, both at an incident angle of 45°. As this arrangement provides two additional reflections in comparison with that shown in FIG. 3, the total phase retardation $\Delta$ is:

$\Delta = 31° - 2 \times 13° = 57° = 1/6.3$ of wavelength which is approximately equal to 1/5 of wavelength, giving rise to a light loss of ca. 29%.

As explained in detail in the foregoing, the present invention is featured in providing the optical system with a phase-difference mirror instead of a double refractive phase plate such as a crystal plate thereby causing a phase retardation, conducting illumination with thus created polarized light, and taking a polarized component approximately orthogonal thereto for observation.

Furthermore, although an optical system for visual observation is cited in the foregoing embodiment, it will be apparent that the observing apparatus of the present invention is also employable in an optical system for photoelectrical alignment of mask and wafer by using a photoelectrical element instead of human eye.

What we claim is:
1. An observing apparatus comprising:
   illuminating means for emitting a linearly polarized light to illuminate a mask for manufacture of a semiconductor circuit element;
   a reflective imaging optical system comprising plural mirrors for focusing an image of said mask onto a wafer, at least one of said plural mirrors being a phase mirror having a reflecting surface which is adapted for causing the direction of polarization of light passed through said mask, then reflected by said wafer and again passed through said mask to be different from the direction of polarization of aforementioned linearly polarized light;
   an observing system for observing said mask and wafer from the side of said illuminating means with respect to said mask; and
   polarizing means, located in said observing optical system, for differentiating a light reflected by said wafer from the aforementioned linearly polarized light.
2. An apparatus according to the claim 1 wherein said reflecting surface is composed of a metallic reflecting surface.
3. An apparatus according to the claim 2 wherein said metallic reflecting surface is composed of aluminum.
4. An observing apparatus comprising:
   illuminating means for emitting a predetermined polarized light to illuminate a mask for manufacture of a semiconductor circuit element;
   a reflective imaging optical system for focusing an arc-shaped area image of said mask onto a wafer, said reflective imaging optical system including at least one phase mirror adapted for causing the state of polarization of light passed through said mask, then reflected by said wafer and again passed through said mask to be different from the state of polarization of said predetermined polarized light;
   an observing optical system for observing said mask and wafer from the side of said illuminating means with respect to said mask; and
   polarizing means, located in said observing optical system for differentiating a light reflected by said wafer from said predetermined polarized light.

* * * * *

UNITED STATES PATENT AND TRADEMARK OFFICE
CERTIFICATE OF CORRECTION

PATENT NO. : 4,389,084

DATED : June 21, 1983

INVENTOR(S) : MIKICHI BAN, ET AL.

It is certified that error appears in the above-identified patent and that said Letters Patent is hereby corrected as shown below:

Column 1

Line 19, delete "wafer".

Column 4

Line 7, change "$\delta_3\delta_4$" to -- $\delta_3+\delta_4$ --.

Column 6, line 5
(Claim 1, line 2)

Delete "a".

UNITED STATES PATENT AND TRADEMARK OFFICE
CERTIFICATE OF CORRECTION

PATENT NO. : 4,389,084

DATED : June 21, 1983

INVENTOR(S) : MIKICHI BAN, ET AL.

It is certified that error appears in the above-identified patent and that said Letters Patent is hereby corrected as shown below:

Column 6, line 17
(Claim 1, line 14)

After "observing", first occurrence, insert --optical--.

Signed and Sealed this

Sixth Day of December 1983

[SEAL]

Attest:

GERALD J. MOSSINGHOFF

Attesting Officer

Commissioner of Patents and Trademarks